United States Patent
Liao

(10) Patent No.: US 8,031,520 B2
(45) Date of Patent: Oct. 4, 2011

(54) METHOD FOR READING AND PROGRAMMING A CHARGE-TRAP MEMORY DEVICE COMPENSATED FOR AN ARRAY/SECOND-BIT/NEIGHBOR-BIT EFFECT

(75) Inventor: Chun-Yu Liao, Taichung (TW)

(73) Assignee: Macronix International Co., Ltd., Hsinchu (TW)

( * ) Notice: Subject to any disclaimer, the term of this patent is extended or adjusted under 35 U.S.C. 154(b) by 658 days.

(21) Appl. No.: 12/195,713

(22) Filed: Aug. 21, 2008

(65) Prior Publication Data
US 2010/0046296 A1 Feb. 25, 2010

(51) Int. Cl.
*G11C 16/34* (2006.01)
(52) U.S. Cl. ......... 365/185.02; 365/185.03; 365/185.22; 365/185.2; 365/185.18
(58) Field of Classification Search .............. 365/185.22, 365/185.2, 185.18, 185.29, 185.02, 185.03
See application file for complete search history.

(56) References Cited

U.S. PATENT DOCUMENTS

| 7,157,773 | B2 * | 1/2007 | Kato et al. ................... 257/347 |
| 7,411,833 | B2 * | 8/2008 | Chu et al. ................ 365/185.22 |
| 2006/0104113 | A1 * | 5/2006 | Hsieh et al. ................ 365/185.2 |
| 2011/0075473 | A1 * | 3/2011 | Park et al. ..................... 365/163 |

* cited by examiner

*Primary Examiner* — Andrew Q Tran
(74) *Attorney, Agent, or Firm* — Thomas|Kayden

(57) ABSTRACT

A method for programming a memory is provided. The memory includes a number of cells and has a preset PV level for a target cell. The method includes programming a first-side of the target cell to have a Vt level not lower than the preset PV level; reading a Vt level of a second-side of the target cell and accordingly obtaining a corrected PV level corresponding to the first-side; and programming the first-side of the target cell to have a Vt level not lower than the corresponding corrected PV level.

25 Claims, 8 Drawing Sheets

LUT1

| Vt1 | Vt2 | ΔPV1 |
|---|---|---|
| 5V | 5V | 0.1V |
| 5V | 5.5V | 0.12V |
| ⋮ | ⋮ | ⋮ |

LUT3

| WL | ΔPV3 |
|---|---|
| WL1 | 0.1V |
| WL2 | 0.12V |
| ⋮ | ⋮ |

LUT4

| Vt1 | Vt2 | ΔRL1 |
|---|---|---|
| 5V | 5V | 0.1V |
| 5V | 5.5V | 0.12V |
| ⋮ | ⋮ | ⋮ |

FIG. 7A

LUT5

| Vt3 | ΔRL2 |
|---|---|
| 5V | 0.05V |
| 6V | 0.07V |
| ⋮ | ⋮ |

FIG. 7B

LUT6

| WL | ΔRL3 |
|---|---|
| WL1 | 0.1V |
| WL2 | 0.12V |
| ⋮ | ⋮ |

FIG. 7C

| Vt1 | ΔPV1 |
|---|---|
| 5V | 0.15V |
| 5.5V | 0.17V |
| ⋮ | ⋮ |

FIG. 9

METHOD FOR READING AND PROGRAMMING A CHARGE-TRAP MEMORY DEVICE COMPENSATED FOR AN ARRAY/SECOND-BIT/NEIGHBOR-BIT EFFECT

BACKGROUND OF THE INVENTION

1. Field of the Invention

The invention relates in general to a method for reading and programming a memory, and more particularly to a method for reading and programming a memory, which corrects the program verify (PV) level, erase verify (EV) level or read reference level of the first-side and the second-side of each cell by considering an array effect, a second-bit effect and a neighbor-bit effect.

2. Description of the Related Art

In the traditional flash memory, such as a multi-level cell (MLC) memory, has two sides in each memory cell and each side, having at least one bit, is set to have a preset PV level in a program operation and have a preset reference level for read/PV/EV in a read operation. For example, if the MLC memory has one bit in each side of the memory cell, there are four possible Vt distributions for each cell: "11", "10", "01" and "00". These reference levels are normally kept at a constant value in the whole program or read operation without considering the cell characteristics of the neighboring cells.

FIG. 1A shows an example of the second-side and neighbor side for a first-side of a specific cell to be programmed or read during source side sensing. As shown in FIG. 1A, supposed the first-side B2 of the cell B is to be programmed or read, the other side B1 of the cell B is defined as a second-side of the first-side B2.

When the memory array becomes larger, the sensed threshold voltage (Vt) level of each cell will deviate from an initial Vt level by a shift value due to a parasitic-resistance effect (an array effect), a second-bit effect and a neighbor-bit effect existing in the cell current sensing path as shown in FIG. 1B. The second-bit effect and neighbor-bit effect will be more and more significant when each cell of the memory is scaling down. As a result, the sensing window SW1 between Vt distributions "11", "10", "01" and "00" of the memory becomes smaller than the sensing window SW0 without Vt shift (as shown in FIG. 1B) and thus the memory cycling margin is greatly reduced.

SUMMARY OF THE INVENTION

The invention is directed to a method for reading and programming a memory. The sensing level for the PV/EV/ read operation is corrected by considering the array effect, second-bit effect and neighbor-bit effect of each cell, and thus the memory margin can be effectively improved.

According to a first aspect of the present invention, a method for programming a memory is provided. The memory comprises a plurality of cells and has a preset PV level for a target cell. The method comprises programming a first-side of the target cell to have a Vt level not lower than the preset PV level; reading a Vt level of a second-side of the target cell and accordingly obtaining a corrected PV level corresponding to the first-side; and programming the first side of the target cell to have a Vt level not lower than the corresponding corrected PV level.

According to a second aspect of the present invention, a method for reading a memory is provided. The memory comprises a plurality of cells and has a preset reference level for a first-side of a target cell. The method comprises reading a Vt level of a second-side of the target cell and accordingly obtaining a corrected reference level corresponding to the first-side; and reading the first-side of the target cell based on the corrected reference level.

According to a third aspect of the present invention, a method for programming a memory is provided. The memory comprises a plurality of cells, each cell has a first-side and a second-side and each of the first-side and the second-side has a preset PV level. The method comprises programming the first-side to have a Vt level not lower than the preset PV level; reading a Vt level of the first-side and accordingly obtaining a first corrected PV level for the corresponding second-side; and programming the second-side to have a Vt level not lower than the corresponding first corrected PV level.

The invention will become apparent from the following detailed description of the preferred but non-limiting embodiments. The following description is made with reference to the accompanying drawings.

BRIEF DESCRIPTION OF THE DRAWINGS

FIGS. 7A~7C are lookup tables used for obtaining the first PV-adjusting value, the second PV-adjusting value and the third PV-adjusting value in the steps 600~620 of FIG. 6.

FIG. 9 is a lookup table used for obtaining the first PV-adjusting value in the step 810 of FIG. 8.

DETAILED DESCRIPTION OF THE INVENTION

The invention is directed to a method for reading and programming a memory. In the program or read operation, the PV/EV/read reference level of each side of a target cell is corrected by considering the array effect, second-bit effect and neighbor-bit effect in order to enlarge the sensing window of the memory. In the following description, two embodiments are taken for illustrating how to consider the array effect, second-bit effect and neighbor-bit effect for each side in the method of the invention.

Embodiment One

Figure 2:
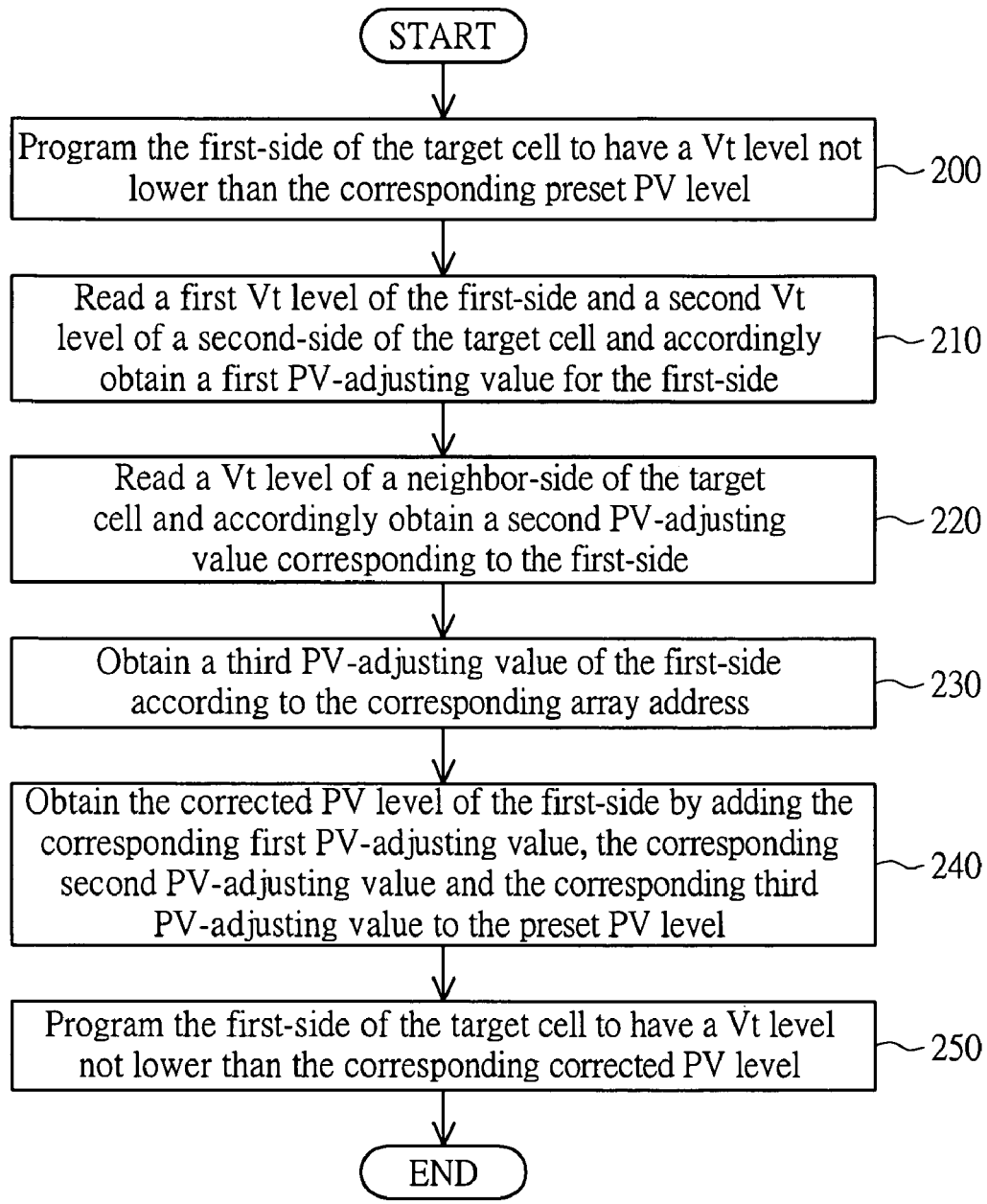
FIG. 2 is a flow chart of a method for programming a memory according to a first embodiment of the invention.

Referring to FIG. 2, a flow chart of a method for programming a memory according to a first embodiment of the invention is shown. The memory, such as a MLC flash memory, has a number of cells, and each cell has a first-side and a second-side. Each side has at least one bit. For example, each side has one bit. Each side has a preset PV level PV0 for a specific program state, such as 10, 01 or 00.

Figures 3, 4A, 4B:
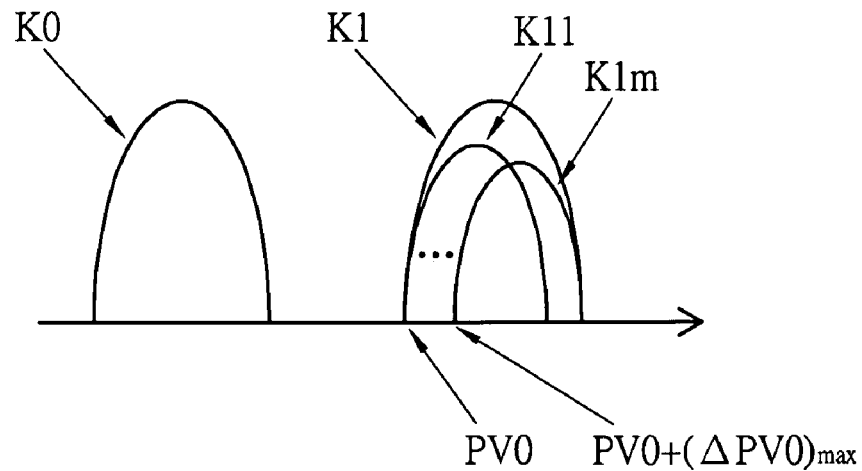
FIG. 3 is a diagram of the Vt distribution of the programmed cells in the step 200 of FIG. 2.
FIGS. 4A~4C are lookup tables used for obtaining the first PV-adjusting value, the second PV-adjusting value and the third PV-adjusting value in the steps 210~230 of FIG. 2.

First, in step 200, program a first-side of a target cell to have a Vt level not lower than the corresponding preset PV level PV0 or the corresponding preset PV level PV0 offset by a PV-adjusting value ΔPV0, i.e. (PV0+ΔPV0). The PV-adjusting value ΔPV0 may be different for the first-side of each target cell. As shown in FIG. 3, the left distribution K0 is a Vt-distribution of the erase-state cells with the Vt-shift, and the right distribution K1 is a "10"-state Vt-distribution after considering the array effect of each programmed cell. The Vt-distribution K1 is consisted of many Vt-distributions including a Vt-distribution K10 of the cells with the ideal program state "10" (i.e. without the second-bit, neighbor-bit and array effects), and a Vt-distribution K1$m$ of the cells corresponding to the maximum PV-adjusting value $(\Delta PV0)_{max}$. The PV-adjusting value ΔPV0 of each side is obtained according to the corresponding array address. For example, the PV-adjusting value ΔPV0 can be obtained by checking a lookup table (LUT) based on the array address, which is normally ranged between 0V~0.4 V.

As shown in FIG. 3, the Vt distribution of the programmed cells will have a Vt shift due to the array effect, second-bit effect and neighbor-bit effect. Thus, in the following steps, the second-bit effect, neighbor-bit effect and array effect are successively considered in correction of the PV level PV0 for each side. Next, in step 210, read a first Vt level Vt1 of the first-side and a second Vt level Vt2 of a second-side of the target cell and accordingly obtain a first PV-adjusting value ΔPV1 for the first-side. For example, a lookup table LUT1 can be used to obtain the value ΔPV1 for each set of the values Vt1 and Vt2 as shown in FIG. 4A, and the value ΔPV1 is normally ranged between 0V~0.4 V.

In this embodiment, a second Vt level Vt2 of a second-side of the target cell is also affected by the first Vt level Vt1 of the first-side, and thus both of the Vt level Vt1 of the first-side and the Vt level Vt2 of the second-side of the target cell are considered in calculation of the first PV-adjusting value ΔPV1. In another embodiment, the step 210 may be performed to read only a Vt level of a second-side of the target cell and accordingly obtain the first PV-adjusting value ΔPV1 of the first-side.

Following that, in step 220, read a Vt level Vt3 of a neighbor side of the target cell and accordingly obtain a second PV-adjusting value ΔPV2 corresponding to the first-side. For example, a lookup table LUT2 can be used to obtain the second PV-adjusting value ΔPV2 based on the value Vt3 as shown in FIG. 4B. The value ΔPV2 is normally ranged between 0V~0.1 V.

Figures 4C, 5:
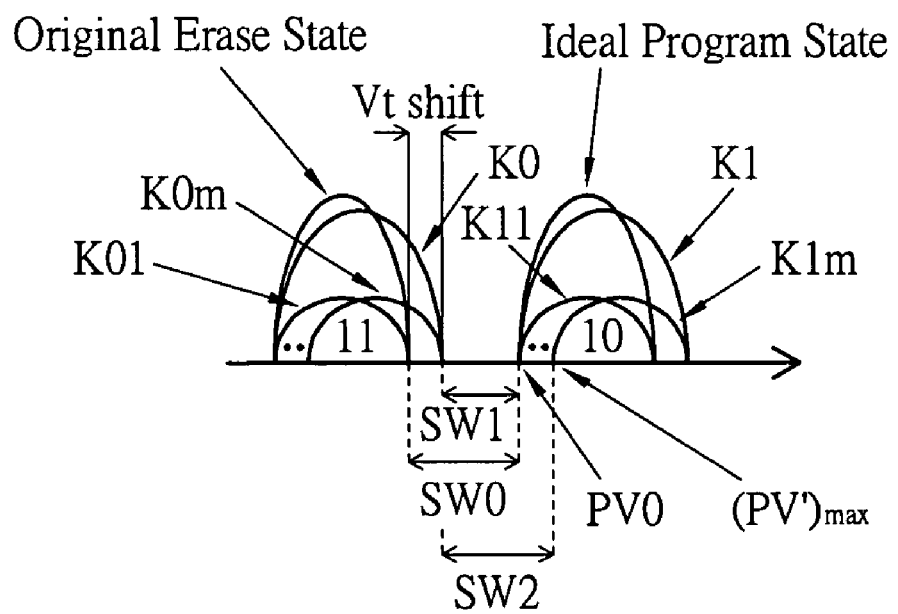
FIG. 5 is a diagram of the Vt distribution of the programmed cells based on the corrected PV level in the method of FIG. 2.

Afterward, in step 230, obtain a third PV-adjusting value ΔPV3 of the first-side according to the corresponding array address. Similar to the step 200, after each side has been programmed to reach the preset PV level PV0 or the level (PV0+ΔPV0), the array-effect is considered again to correct the PV level for the first-side since the array-effect still exists in the following program operation. For example, a lookup table LUT3 can be used to obtain the value ΔPV3 of the first-side based on the corresponding array address as shown in FIG. 4C. Normally, the sides in the same word line (WL) have the same array effect and thus the value ΔPV3 of each side is determined according to the word-line (WL1, WL2, . . . ) position of the side in the lookup table LUT3. The value ΔPV3 is normally ranged between 0V~0.2V.

In step 240, obtain the corrected PV level PV' of the first-side by adding the corresponding first PV-adjusting value ΔPV1, the corresponding second PV-adjusting value ΔPV2 and the corresponding third PV-adjusting value ΔPV3 to the preset PV level PV0, that is, PV'=PV0+ΔPV1+ΔPV2+ΔPV3. The value PV' is larger than PV0.

Finally, in step 250, program the first-side of the target cell to have a Vt level not lower than the corresponding corrected PV level PV'. The corrected PV level PV' may be different for the first-side of each target cell. The Vt distribution "10" of the cells programmed according to the corrected PV level PV' in the step 250 is shown in FIG. 5. As shown in FIG. 5, the total Vt-distribution K0 of the erase-state cells with the Vt-shift due to the second-bit, neighbor-bit and array effects is consisted of many distributions including a Vt-distribution K01 of the erase-state cells having no Vt-shift and a Vt-distribution K0$m$ of the erase-state cells with the maximum Vt-shift, while the total Vt-distribution K1 of the "10"-state cells with the Vt-shift due to the second-bit, neighbor-bit and array effects is consisted of many distributions including a Vt-distribution K11 of the cells with the ideal program state (having no Vt-shift) and a Vt-distribution K1$m$ of the cells corresponding to the maximum corrected PV level $(PV')_{max}$. The Vt-distributions K11~K1$m$ are respectively corresponding to K01~K0$m$. Owing that the PV level of the side to be programmed has been adjusted to the corrected PV level PV' (a larger value than PV0) by considering the second-bit effect, neighbor-bit effect and array effect, the program operation based on the corrected PV level PV' can have a larger operation window SW2, which is ranged from the maximum of the erase-state Vt-distribution with the Vt-shift to the minimum of the Vt-distribution corresponding to the maximum corrected PV level $(PV')_{max}$, than the prior-art sensing window SW1, thereby increasing the memory cycling margin. It is noted that the sensing window SW2 of the embodiment is larger than the prior-art sensing window SW1 and is close to the ideal sensing window SW0 without Vt shift, which is ranged between the original erase-state Vt-distribution and the ideal-program-state Vt-distribution.

Although the method for programming a memory is exemplified to respectively obtain the first PV-adjusting value, the second PV-adjusting value and the third PV-adjusting value of the first-side according to the Vt levels of a second-side and a neighbor side of the target cell and the corresponding array address via lookup tables and accordingly obtain the corrected PV level PV' in the embodiment, the method of the invention can also read only the Vt level of a second-side of the target cell in the step 200 and accordingly obtain the corrected PV level PV' (PV'=PV0+ΔPV1) since the second-bit effect is dominating as compared to the neighbor-bit effect and array effect.

Besides, any other software or firmware design can also be used to obtain the above PV-adjusting values in addition to checking the lookup tables. As long as the dominating second-bit effect is considered to correct the PV level and the program operation is performed based on the corrected PV level to achieve the purpose of increasing the operation window, all the alternatives are not apart from the scope of the invention.

Figure 6:
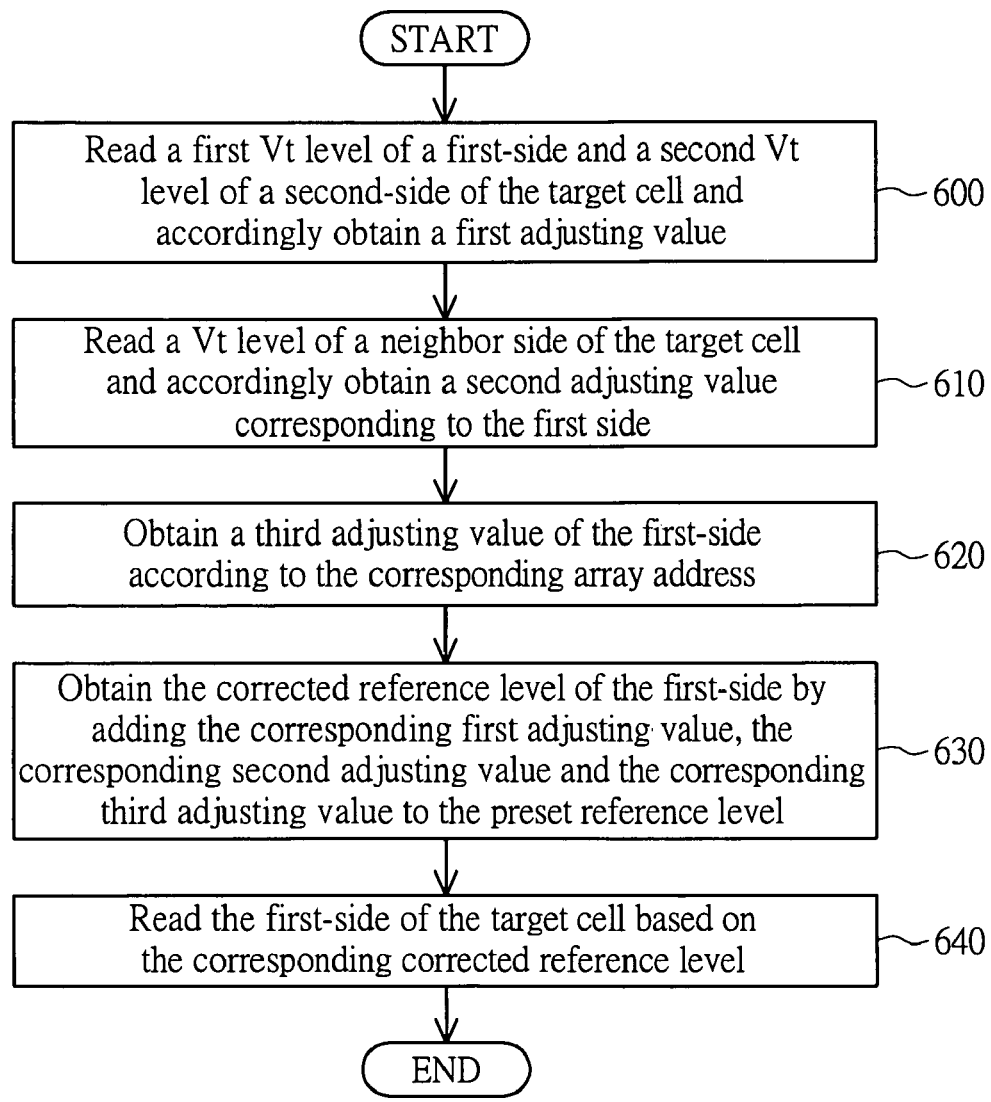
FIG. 6 is a flow chart of a method for reading a memory according to the first embodiment of the invention.

Referring to FIG. 6, a flow chart of a method for reading a memory according to the first embodiment of the invention is shown. The read operation of the memory is based on a preset reference level RL0, such as a PV level, an EV level or a read reference level. First, in step 600, read a first Vt level Vt1 of a first-side and a second Vt level Vt2 of a second-side of a target cell, and accordingly obtain a first adjusting value ΔRL1. For example, a lookup table LUT4 can be used to obtain the value ΔRL1 for each set of the values Vt1 and Vt2 as shown in FIG. 7A, and the value ΔRL1 is normally ranged between 0V~0.4 V.

In this embodiment, a second Vt level Vt2 of a second-side of the target cell is also affected by the first Vt level Vt1 of the first-side, and thus both of the Vt level Vt1 of the first side and the Vt level Vt2 of the second-side of the target cell are considered in calculation of the first adjusting value ΔRL1. In another embodiment, the step 600 may be performed to read only a Vt level of a second-side of the target cell and accordingly obtain the first adjusting value ΔRL1 of the first-side.

Following that, in step 610, read a Vt level Vt3 of a neighbor side of the target cell and accordingly obtain a second adjusting value ΔRL2 corresponding to the first-side. For example, a lookup table LUT5 can be used to obtain the second adjusting value ΔRL2 based on the value Vt3 as shown in FIG. 7B, and the value ΔRL2 is normally ranged between 0V~0.1V.

Afterward, in step 620, obtain a third adjusting value ΔRL3 of the first-side according to the corresponding array address. For example, a lookup table LUT6 can be used to obtain the value ΔRL3 of the first-side based on the corresponding array address as shown in FIG. 7C. The value ΔRL3 of each side is determined according to the word-line (WL1, WL2, . . . ) position of the side in the lookup table LUT6, and is normally ranged between 0V~0.2V.

In step 630, obtain the corrected reference level RL' of the first-side by adding the corresponding first adjusting value ΔRL1, the corresponding second adjusting value ΔRL2 and the corresponding third adjusting value ΔRL3 to the preset reference level RL0, that is, RL'=RL0+ΔRL1+ΔRL2+ΔRL3. The value RL' is larger than RL0.

Finally, in step 640, read the first-side of the target cell based on the corresponding corrected reference level RL'. Owing that the reference level RL0 has been adjusted to the corrected reference level RL' (a larger value than RL0) by considering the second-bit effect, neighbor-bit effect and array effect, the read operation based on the corrected reference level RL' can have a larger read window than the prior art, thereby increasing the memory cycling margin.

Although the method for reading a memory is exemplified to respectively obtain the first adjusting value, the second adjusting value and the third adjusting value of the first-side of a target cell according to the Vt levels of a second-side and a neighbor side of the target cell and the corresponding array address via lookup tables and accordingly obtain the corrected reference level RL' in the embodiment, the method of the invention can also read only the Vt level of a second-side of the target cell in the step 600 and accordingly obtain the corrected reference level RL' (RL'=RL0+ΔRL1).

Besides, any other software or firmware design can also be used to obtain the above adjusting values in addition to checking the lookup tables. As long as the dominating second-bit effect is considered to correct the reference level and the read operation is performed based on the corrected reference level to achieve the purpose of increasing the read window, all the alternatives are not apart from the scope of the invention.

Embodiment Two

Figure 1A:
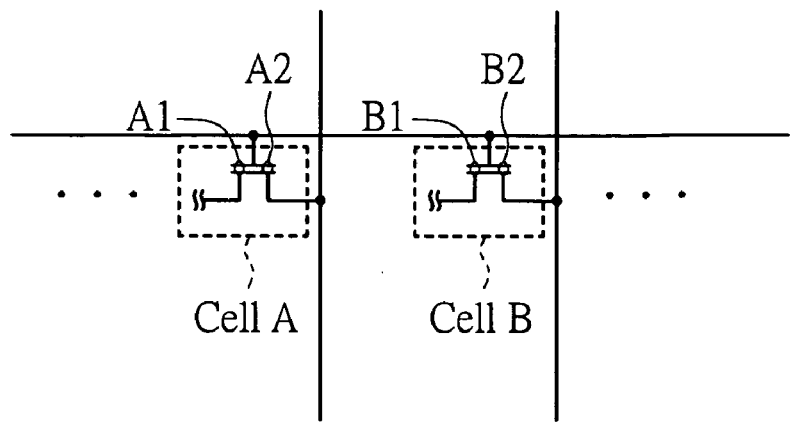
FIG. 1A (Prior Art) is an example of the second-side and neighbor side for a specific cell to be programmed or read during source side sensing.
Figure 1B:
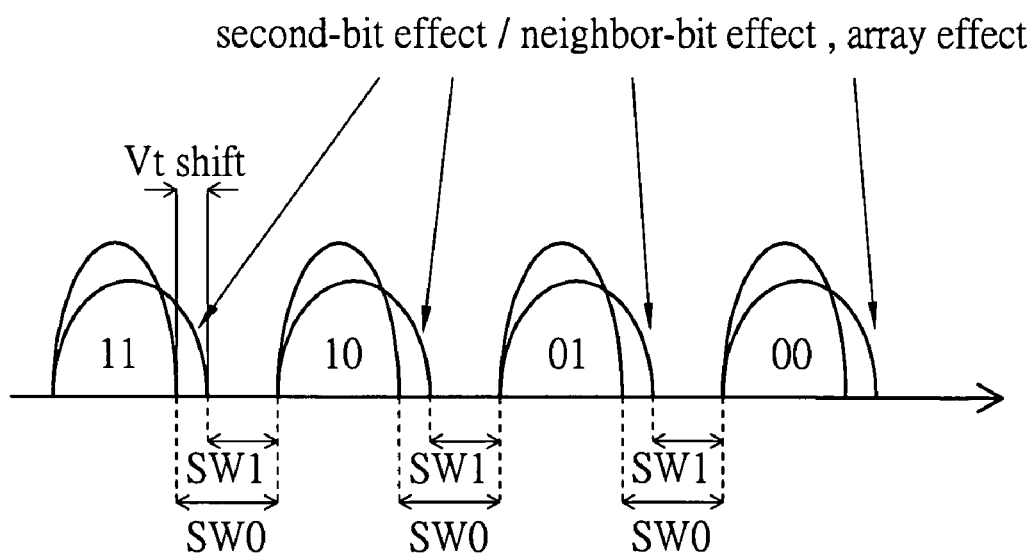
FIG. 1B (Prior Art) is a schematic diagram of the Vt shift of the programmed cells in a conventional memory.
Figure 8:
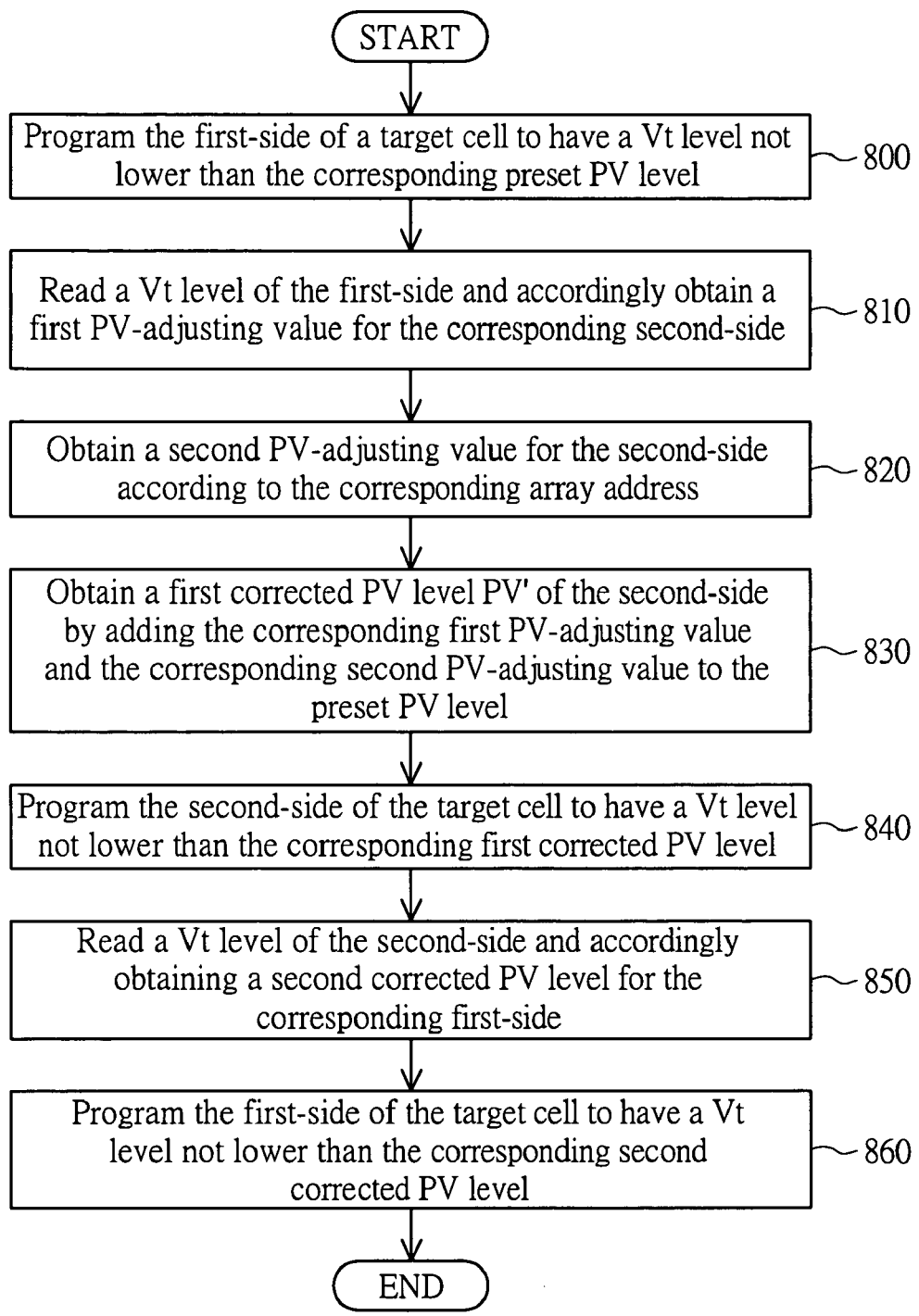
FIG. 8 is a flow chart of a method for programming a memory according to a second embodiment of the invention.

Referring to FIG. 8, a flow chart of a method for programming a memory according to a second embodiment of the invention is shown. The memory, such as a MLC flash memory, includes a number of cells. Each cell has a first-side and a second-side, and each side has at least one bit. For example, the first-side is the left-side A1/B1 and the second-side is the right-side A2/B2 in the cell A/B as shown in FIG. 1A. Each side has a preset PV level PV0 for a specific state, such as 10, 01 or 00.

First, in step 800, program the first-side of a target cell to have a Vt level not lower than the corresponding preset PV level PV0 or the corresponding preset PV level PV0 offset by a PV-adjusting value ΔPV0, i.e. (PV0+ΔPV0). The PV-adjusting value ΔPV0 of the first-side is obtained according to the corresponding array address. For example, the PV-adjusting value ΔPV0 can be obtained by checking a lookup table based on the array address, which is normally ranged between 0V~0.4V.

Figure 9:
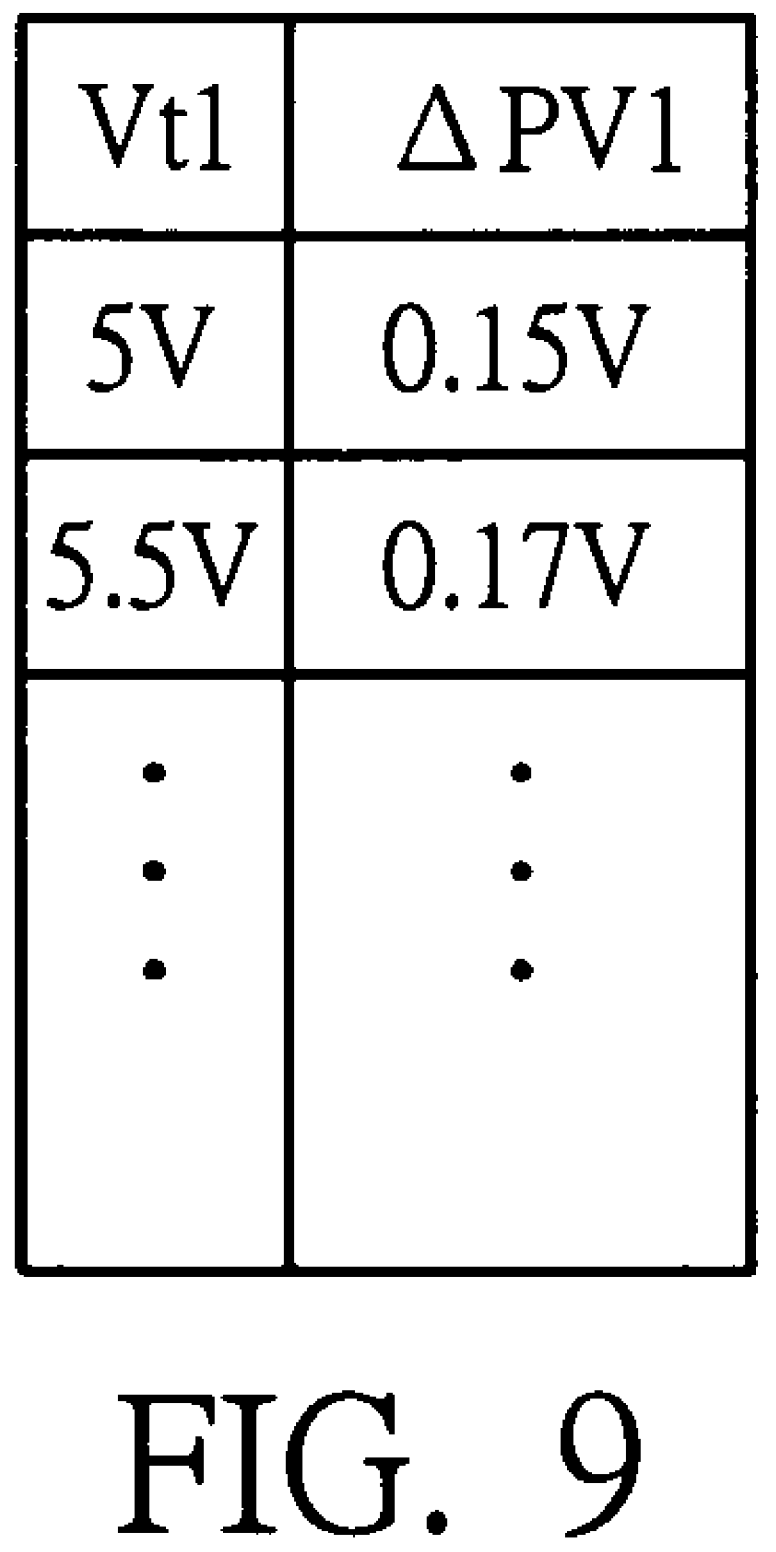

Next, in step 810, read a Vt level Vt1 of the first-side and accordingly obtain a first PV-adjusting value ΔPV1 for the corresponding second-side. For example, a lookup table LUT7 can be used to obtain the value ΔPV1 for each value Vt1 as shown in FIG. 9, and the value ΔPV1 is normally ranged between 0V~0.4 V.

Following that, in step 820, obtain a second PV-adjusting value ΔPV2 for the second-side according to the corresponding array address. Similar to the step 800, after the first-side has been programmed to reach the preset PV level PV0 or the level (PV0+ΔPV0), the array-effect is considered again to correct the PV level PV0 for the corresponding second-side. For example, the lookup table LUT3 of FIG. 4C can be used to obtain the value ΔPV2 (in a right column) of the second-side based on the corresponding array address (in a left column). The value ΔPV2 is normally ranged between 0V~0.2V.

In step 830, obtain a first corrected PV level PV' of the second-side by adding the corresponding first PV-adjusting value ΔPV1 and the corresponding second PV-adjusting value ΔPV2 to the preset PV level PV0, that is, PV'=PV0+ΔPV1+ΔPV2. The value PV' is larger than PV0.

In step 840, program the second-side of the target cell to have a Vt level not lower than the corresponding first corrected PV level PV'. The step 840 is performed to program the second-side based on the first corrected PV level PV'. After the second-side of the target cell in the memory is programmed, the method of the second embodiment can further include a step 850 of reading a Vt level of the second-side and accordingly obtaining a second corrected PV level PV" for the corresponding first-side; and a step 860 of programming the first-side of the target cell to have a Vt level not lower than the corresponding second corrected PV level PV". The purpose of the steps 850 and 860 is to correct the PV level of the first-side of target cell by considering the second-bit effect and program the first-side to reach the corrected PV level PV" since the Vt level of the first-side will still be affected after the corresponding second-side is programmed.

Owing that the PV level for the second-side of target cell is corrected to level PV' and the PV level for the first-side of target cell is corrected to the level PV" by considering the second-bit effect and array effect, the program operation based on the corrected PV levels PV' and PV" can have a larger operation window than the prior art, thereby increasing the memory cycling margin.

Although the method for programming a memory is exemplified to respectively obtain the first PV-adjusting value and the second PV-adjusting value of the second-side according to the Vt level of the corresponding first-side and the corresponding array address via lookup tables and accordingly obtain the corrected PV level PV' in the embodiment, the method of the invention can also obtain the corrected PV level PV' according to the Vt level of the first-side. Besides, any other software or firmware design can also be used to obtain the above PV-adjusting values in addition to checking the lookup tables. As long as the dominating second-bit effect is considered to correct the PV level for the second-side of target cell and the program operation is performed based on the corrected PV level to achieve the purpose of increasing the operation window, all the alternatives are not apart from the scope of the invention.

The method for reading and programming a memory disclosed by the embodiments of the invention corrects the PV level of a first-side of target cell to a corrected PV level by considering the second-bit effect, the neighbor-bit effect and the array effect on the first-side. Therefore, the real cell Vt distribution (without the above effects) will be tighter than that of the prior art for the program and erase operations. The operation window of the memory can be enlarged and thus the memory cycling margin can be effectively increased. Besides, the erase uniformity of the memory can also be improved.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for programming a memory, the memory comprising a plurality of cells and having a preset program verify (PV) level for a target cell, the method comprising:
   (a) programming a first-side of the target cell to have a threshold voltage (Vt) level not lower than the corresponding preset PV level;
   (b) reading a Vt level of a second-side of the target cell and accordingly obtaining a corrected PV level corresponding to the first-side; and
   (c) programming the first-side of the target cell to have a Vt level not lower than the corresponding corrected PV level.

2. The method according to claim 1i, wherein the step (a) further comprises programming the first-side of the target cell to have a Vt level not lower than the corresponding preset PV level offset by a PV-adjusting value, wherein the PV-adjusting value of the target cell is obtained according to a corresponding array address.

3. The method according to claim 1, wherein the step (b) further comprises:
   reading a Vt level of a neighbor side of the target cell and obtaining the corrected PV level according to the Vt level of the neighbor side.

4. The method according to claim 3, wherein the step (b) further comprises:
   obtaining the corrected PV level corresponding to the first-side according to a corresponding array address.

5. The method according to claim 4, wherein the step (b) further comprises:
   respectively obtaining a first PV-adjusting value, a second PV-adjusting value and a third PV-adjusting value of the target cell according to the Vt levels of the corresponding second-side and the corresponding neighbor side and the corresponding array address; and
   obtaining the corrected PV level corresponding to the first-side by adding the first PV-adjusting value, the second PV-adjusting value and the third PV-adjusting value to the preset PV level.

6. The method according to claim 5, wherein the step of respectively obtaining the first PV-adjusting value, the second PV-adjusting value and the third PV-adjusting value further comprises checking a lookup table (LUT).

7. The method according to claim 5, wherein the first PV-adjusting value is 0V~0.4V.

8. The method according to claim 5, wherein the second PV-adjusting value is 0V~0.1V.

9. The method according to claim 5, wherein the third PV-adjusting value is 0V~0.2V.

10. The method according to claim 1, wherein the step (b) further comprises:
    reading a first Vt level of the first-side and a second Vt level of a second-side of the target cell; and
    obtaining the corrected PV level of the first-side according to the first Vt level and the second Vt level.

11. A method for reading a memory, the memory comprising a plurality of cells and having a preset reference level for a first-side of a target cell, the method comprising:
    (a) reading a Vt level of a second-side of the target cell and accordingly obtaining a corrected reference level corresponding to the first-side; and
    (b) reading the first-side of the target cell based on the corresponding corrected reference level.

12. The method according to claim 11, wherein the step (a) further comprises: reading a Vt level of a neighbor side of the target cell and accordingly obtaining the corrected reference level corresponding to the first-side.

13. The method according to claim 12, wherein the step (a) further comprises:
    obtaining the corrected reference level of the first-side according to a corresponding array address.

14. The method according to claim 13, wherein the step (a) further comprises:
    respectively obtaining a first adjusting value, a second adjusting value and a third adjusting value of the first-side according to the Vt levels of the corresponding second-side and the corresponding neighbor side and the corresponding array address; and
    obtaining the corrected reference level corresponding to the first-side by adding the corresponding first adjusting value, the corresponding second adjusting value and the corresponding third adjusting value to the preset reference level.

15. The method according to claim 14, wherein the step of respectively obtaining the first adjusting value, the second adjusting value and the third adjusting value further comprises checking a lookup table (LUT).

16. The method according to claim 14, wherein the first adjusting value is 0V~0.4V.

17. The method according to claim 14, wherein the second adjusting value is 0V~0.1V.

18. The method according to claim 14, wherein the third adjusting value is 0V~0.2V.

19. The method according to claim 11, wherein the step (a) further comprises:
    reading a first Vt level of the first-side and a second Vt level of a second-side of the target cell; and
    obtaining the corrected reference level according to the corresponding first Vt level and the corresponding second Vt level.

20. The method according to claim 11, wherein the reference level comprises a program verify (PV) level, an erase verify (EV) level and a read reference level.

21. A method for programming a memory, the memory comprising a plurality of cells, each cell having a first-side and a second-side, each of the first-side and the second-side having a preset program verify (PV) level, the method comprising:
    (a) programming the first-side to a threshold voltage (Vt) level not lower than the corresponding preset PV level;
    (b) reading a Vt level of the first-side and accordingly obtaining a first corrected PV level for the corresponding second-side; and
    (c) programming the second-side to a Vt level not lower than the corresponding first corrected PV level.

22. The method according to claim 21, wherein the step (a) further comprises programming the first-side to a Vt level not lower than the corresponding preset PV level offset by a PV-adjusting value, wherein the PV-adjusting value of the first-side is obtained according to a corresponding array address.

23. The method according to claim 21, wherein the step (b) further comprises:
   respectively obtaining a first PV-adjusting value and a second PV-adjusting value of the second-side according to the Vt level of the corresponding first-side and the corresponding array address, and
   obtaining the first corrected PV level of the second-side by adding the corresponding first PV-adjusting value and the second PV-adjusting value to the preset PV level.

24. The method according to claim 23, wherein the step of respectively obtaining the first PV-adjusting value and the second PV-adjusting value further comprises checking a lookup table (LUT).

25. The method according to claim 21, further comprising:
   (d) reading a Vt level of the second-side and accordingly obtaining a second corrected PV level for the corresponding first-side; and
   (e) programming the first-side to a Vt level not lower than the corresponding second corrected PV level.

* * * * *